US008639651B2

(12) United States Patent
Beitelmal et al.

(10) Patent No.: US 8,639,651 B2
(45) Date of Patent: Jan. 28, 2014

(54) MANIPULATING ENVIRONMENTAL CONDITIONS IN AN INFRASTRUCTURE

(75) Inventors: Abdlmonem Beitelmal, Los Altos, CA (US); Alan A. McReynolds, Los Altos, CA (US); Cullen E. Bash, Los Gatos, CA (US); Carlos J. Felix, Isabela, PR (US); Christopher Edward Hoover, Campbell, CA (US); Zhikui Wang, Fremont, CA (US)

(73) Assignee: Hewlett-Packard Development Company, L. P., Houston, TX (US)

( * ) Notice: Subject to any disclaimer, the term of this patent is extended or adjusted under 35 U.S.C. 154(b) by 986 days.

(21) Appl. No.: 12/609,937

(22) Filed: Oct. 30, 2009

(65) Prior Publication Data

US 2011/0106314 A1 May 5, 2011

(51) Int. Cl.
*G06F 15/18* (2006.01)

(52) U.S. Cl.
USPC .......................................................... 706/62

(58) Field of Classification Search
None
See application file for complete search history.

(56) References Cited

U.S. PATENT DOCUMENTS

| | | |
|---|---|---|
| 646,590 A | 4/1900 | Williams |
| 378,838 A | 1/1974 | Derneray |
| 4,188,862 A | 2/1980 | Douglas, III |
| 4,497,031 A | 1/1985 | Froehling et al. |
| 4,646,964 A | 3/1987 | Parker et al. |
| 4,672,206 A | 6/1987 | Suzuki et al. |
| 5,145,456 A | 9/1992 | Ito et al. |
| 5,180,331 A | 1/1993 | Daw et al. |
| 5,417,077 A | 5/1995 | Jeffery et al. |
| 5,461,875 A | 10/1995 | Lee et al. |
| 5,493,194 A | 2/1996 | Damiano et al. |
| 5,623,259 A | 4/1997 | Giangardella |
| 5,673,851 A | 10/1997 | Dozier et al. |
| 5,733,188 A | 3/1998 | Jacob |
| 5,810,245 A | 9/1998 | Heitman et al. |
| 5,826,654 A | 10/1998 | Adnan et al. |
| 5,944,098 A | 8/1999 | Jackson |
| 6,010,113 A | 1/2000 | Rotering |
| 6,055,144 A | 4/2000 | Reid |
| 6,070,114 A | 5/2000 | Fendt et al. |

(Continued)

FOREIGN PATENT DOCUMENTS

| | | |
|---|---|---|
| DE | 19927265 | 12/1999 |
| WO | WO-2005057065 | 6/2005 |
| WO | WO2005088204 | 9/2005 |
| WO | WO-2008156741 A2 | 12/2008 |

OTHER PUBLICATIONS

Beitelmal, M. H. et al., "Local Cooling Control of Data Centers With Adaptive Vent Tiles", Proceedings of IPACK2009, ASME InterPACK '09, Jul. 2009.

(Continued)

*Primary Examiner* — Michael B Holmes

(57) ABSTRACT

In a method for manipulating environmental conditions in an infrastructure containing one or more adaptive vent tiles, correlations between opening levels of the one or more adaptive vent tiles and an environmental condition at one or more heat dissipating devices are identified. In addition, one or more environmental conditions at locations proximate to or within the one or more heat dissipating devices are received and errors between the received one or more environmental conditions and one or more reference environmental conditions are identified. Moreover, opening levels for the one or more adaptive vent tiles are determined based upon the identified correlations and errors.

18 Claims, 5 Drawing Sheets

(56) References Cited

U.S. PATENT DOCUMENTS

| | | | |
|---|---|---|---|
| 6,095,867 A | 8/2000 | Brandt et al. | |
| 6,374,627 B1 | 4/2002 | Schumacher et al. | |
| 6,574,104 B2 | 6/2003 | Patel et al. | |
| 6,581,847 B2 | 6/2003 | Kline et al. | |
| 6,659,359 B2 | 12/2003 | Kwak | |
| 6,675,302 B2 | 1/2004 | Ykema | |
| 6,712,335 B1 | 3/2004 | Naughton | |
| 6,868,682 B2 | 3/2005 | Sharma et al. | |
| 6,881,142 B1 | 4/2005 | Nair | |
| 6,882,125 B2 | 4/2005 | Kameda et al. | |
| 6,925,828 B1 | 8/2005 | Gerstner et al. | |
| 6,945,058 B2 | 9/2005 | Bash et al. | |
| 6,971,631 B1 | 12/2005 | Naughton | |
| 6,981,915 B2 | 1/2006 | Moore et al. | |
| 6,995,658 B2 | 2/2006 | Tustison et al. | |
| 7,000,480 B2 | 2/2006 | Kramer | |
| 7,006,949 B2 | 2/2006 | Moore | |
| 7,013,968 B2 | 3/2006 | Beitelmal et al. | |
| 7,031,154 B2 | 4/2006 | Bash et al. | |
| 7,086,603 B2 * | 8/2006 | Bash et al. | 236/51 |
| 7,155,318 B2 * | 12/2006 | Sharma et al. | 700/276 |
| 7,171,328 B1 | 1/2007 | Walker et al. | |
| 7,194,337 B2 * | 3/2007 | Sharma et al. | 700/276 |
| 7,197,433 B2 * | 3/2007 | Patel et al. | 702/188 |
| 7,251,547 B2 | 7/2007 | Bash et al. | |
| 7,272,945 B2 | 9/2007 | Bash et al. | |
| 7,313,461 B2 * | 12/2007 | Sharma et al. | 700/245 |
| 7,313,924 B2 | 1/2008 | Bash et al. | |
| 7,320,638 B2 | 1/2008 | Craig | |
| 7,347,058 B2 | 3/2008 | Malone et al. | |
| 7,447,920 B2 * | 11/2008 | Sharma et al. | 713/300 |
| 7,463,950 B1 | 12/2008 | Brey et al. | |
| 7,475,558 B2 | 1/2009 | Perry | |
| 7,477,028 B2 | 1/2009 | Bokusky et al. | |
| 7,534,167 B2 | 5/2009 | Day | |
| 7,584,021 B2 * | 9/2009 | Bash et al. | 700/276 |
| 7,640,760 B2 | 1/2010 | Bash et al. | |
| 7,669,431 B2 * | 3/2010 | Bash et al. | 62/178 |
| 7,739,073 B2 | 6/2010 | Hamann et al. | |
| 7,856,495 B2 | 12/2010 | Chainer et al. | |
| RE42,195 E * | 3/2011 | Bash et al. | 700/276 |
| 7,902,966 B1 * | 3/2011 | Beitelmal et al. | 340/12.32 |
| 8,019,477 B2 * | 9/2011 | Bash et al. | 700/276 |
| 8,180,494 B2 | 5/2012 | Dawson et al. | |
| 8,255,709 B2 * | 8/2012 | McCarthy et al. | 713/300 |
| 8,352,085 B2 * | 1/2013 | Marwah et al. | 700/277 |
| 8,355,828 B2 * | 1/2013 | Tolia et al. | 700/296 |
| 8,390,454 B2 * | 3/2013 | Lyon et al. | 340/572.1 |
| 2001/0042792 A1 | 11/2001 | Kline et al. | |
| 2004/0176022 A1 | 9/2004 | Thrasher et al. | |
| 2005/0023363 A1 | 2/2005 | Sharma et al. | |
| 2005/0138440 A1 | 6/2005 | Barr et al. | |
| 2005/0182523 A1 | 8/2005 | Nair | |
| 2005/0208888 A1 | 9/2005 | Moore et al. | |
| 2005/0266792 A1 | 12/2005 | Rimmer et al. | |
| 2005/0278071 A1 | 12/2005 | Durham, III | |
| 2006/0075764 A1 | 4/2006 | Bash et al. | |
| 2006/0080001 A1 | 4/2006 | Bash et al. | |
| 2006/0086119 A1 | 4/2006 | Malone et al. | |
| 2006/0091229 A1 | 5/2006 | Bash et al. | |
| 2006/0242908 A1 | 11/2006 | McKinney | |
| 2007/0078635 A1 | 4/2007 | Rasmussen et al. | |
| 2007/0125107 A1 | 6/2007 | Beam | |
| 2007/0167086 A1 | 7/2007 | Tolli | |
| 2007/0235440 A1 | 10/2007 | Gu et al. | |
| 2008/0009237 A1 | 1/2008 | Wu | |
| 2008/0119127 A1 | 5/2008 | Stewart | |
| 2008/0244104 A1 | 10/2008 | Clemente | |
| 2008/0277486 A1 | 11/2008 | Seem et al. | |
| 2009/0173473 A1 | 7/2009 | Day | |
| 2009/0187284 A1 | 7/2009 | Kreiss et al. | |
| 2009/0293518 A1 | 12/2009 | Bettella | |
| 2010/0029193 A1 | 2/2010 | Ahladas et al. | |
| 2010/0105311 A1 | 4/2010 | Meneely, Jr. | |
| 2012/0078422 A1 | 3/2012 | Mejias et al. | |

OTHER PUBLICATIONS

Bash, C. E. et al., "Dynamic Thermal Management of Air Cooled Data Centers", HP Laboratories Palo Alto, HPL-2006-11, Jan. 2006.
Boucher, T. et al., "Viability of Dynamic Cooling Control in a Data Center Environment", UC Berkeley, Jan. 2006.
Awtrey, D ~ "Transmitting Data and Power Over a One-Wire. Bus" ~ Sensors, The Journal of Applied Sensing Technology ~ Feb. 1997 ~ 4 pags.
Computer Dictionary definition of "module" ~ Microsoft Press ~ 1997 p. 313 (3 pgs. total).

* cited by examiner

MANIPULATING ENVIRONMENTAL CONDITIONS IN AN INFRASTRUCTURE

CROSS REFERENCE TO RELATED APPLICATIONS

The present application contains similar subject matter and refers to commonly assigned and copending U.S. patent application Ser. No. 10/976,786, filed on Nov. 1, 2004, by Cullen E. Bash et al., and entitled "Control of Vent Tiles Correlated with a Rack", U.S. patent application Ser. No. 10/960,573, filed on Oct. 8, 2004 by Cullen E. Bash et al., and entitled "Correlation of Vent Tiles and Racks", U.S. patent application Ser. No. 11/353,557, filed on Feb. 14, 2006, by Cullen E. Bash et al., and entitled "Ventilation Tile with Collapsible Damper"; U.S. patent application Ser. No. 11/764,410, filed on Jun. 18, 2007, by Abdlmonem H. Beitelmal et al., and entitled, "Microcontroller for Controlling an Actuator"; and U.S. patent application Ser. No. 12/480,429, filed on Jun. 8, 2009, by Alan A. McReynolds et al., and entitled "Vent Tile with an Integrated Thermal Imaging Sensor and Controller". The disclosures of which are hereby incorporated by reference in their entireties.

BACKGROUND

In data centers with raised floor architectures, vent tiles are typically distributed over the raised floor and locally distribute airflow from a plenum formed below the raised floor. The plenum is pressurized with cold air by blowers in one or more computer room air conditioning (CRAC) units. The vent tiles allow cold air to escape from the plenum and to travel from the raised floor to the intakes of rack-mounted equipment. The most common vent tile has a fixed 25% opening, however, vent tiles with larger fixed openings are available in standard sizes of 47%, 56% and 85%. In addition, it is common to install the vent tiles in front of each rack containing equipment. Consequently, the airflow provided to the equipment is relatively constant, as the tile configuration and blower speed are fixed and rarely changed.

However, the environment of a data center is dynamic because workload placement and power dissipation fluctuate considerably over time and space. To compensate for these fluctuations, zonal controllers are typically employed to control the CRAC set points and/or blower speeds in real time, and maintain the return air temperatures to the CRAC units below certain thresholds, or the highest intake temperatures of racks in thermal zones below their thresholds. Nevertheless, the zonal controllers are designed to respond to return air temperatures or the hot spots in thermal zones that can be affected by the CRAC units. As such, the temperature distribution inside the thermal zones is still non-uniform, which often results in overprovisioning of cooling capacity and is thus inefficient.

Another compensation technique is to manually adjust the vent tiles, for instance, by adding or moving the vent tiles based upon a prediction of where the vent tiles are needed to compensate for changing conditions in the data center environment. However, manual adjustment of the vent tiles is labor-intensive, error-prone and often non-intuitive. Thermal models are often developed to assist with the vent tile adjustments, but these models are typically time-consuming to generate and require skilled users to achieve accurate results.

BRIEF DESCRIPTION OF THE DRAWINGS

Features of the present invention will become apparent to those skilled in the art from the following description with reference to the figures, in which.

DETAILED DESCRIPTION OF THE INVENTION

For simplicity and illustrative purposes, the present invention is described by referring mainly to an exemplary embodiment thereof. In the following description, numerous specific details are set forth in order to provide a thorough understanding of the present invention. It will be apparent however, to one of ordinary skill in the art, that the present invention may be practiced without limitation to these specific details. In other instances, well known methods and structures have not been described in detail so as not to unnecessarily obscure the present invention.

Disclosed herein are a method and a controller for manipulating environmental conditions in an infrastructure containing one or more adaptive vent tiles (AVTs). The controller is configured to implement a model that identifies correlations between opening levels of the AVTs and the conditions detected at or within heat dissipating devices. The controller is also configured to determine opening levels for the AVTs through evaluation of the correlations and a feedback loop that evaluates errors between detected environmental conditions and reference environmental conditions.

Through implementation of the method and controller disclosed herein, settings for the AVTs that optimize local airflow distribution, for instance, by providing exact amounts of cooling airflow, fine-grained electronic component intake temperature control, reduction in energy waste, increased cooling efficiency and capacity in an infrastructure, etc. may automatically be determined. In addition, the AVTs may automatically and remotely be controlled to have the determined settings, which reduce the labor costs associated with manually configuring and tuning conventional vent tiles.

Figure 1:
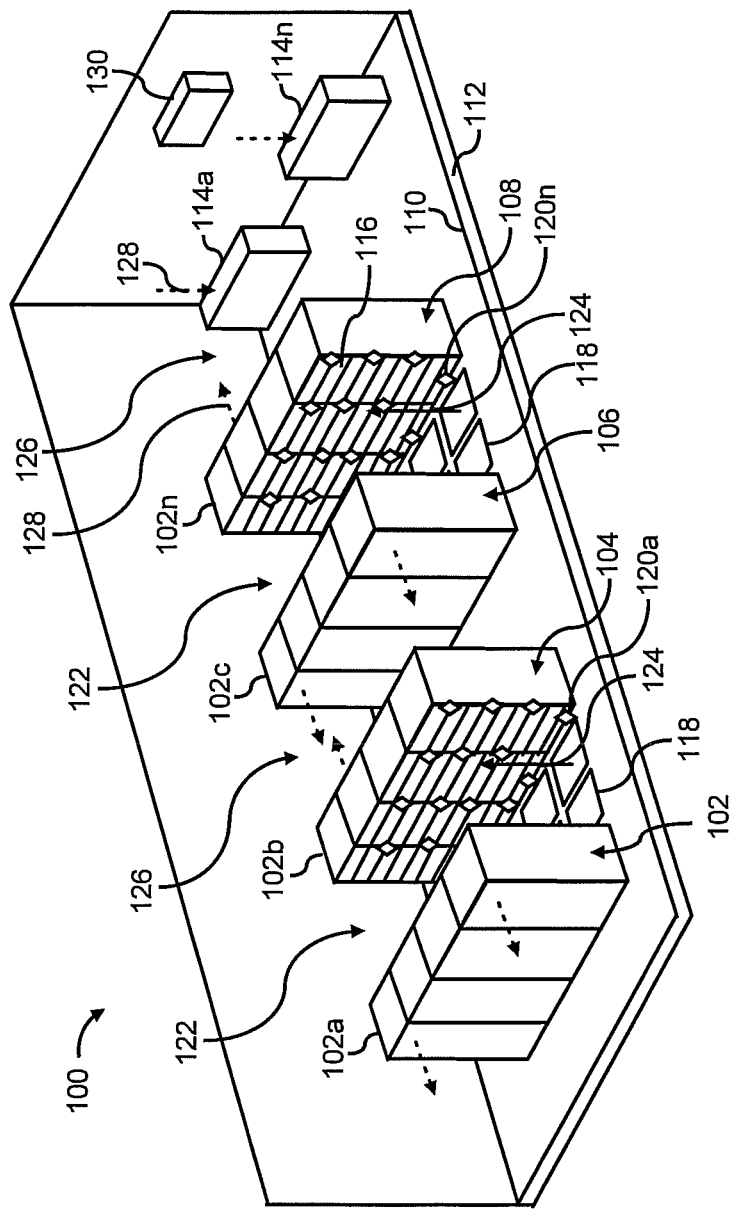
FIG. 1 shows a simplified perspective view of a section of an infrastructure, in this instance, a data center, in which a method and controller for controlling one or more adaptive vent tiles (AVTs) may be implemented, according to an embodiment of the invention.

With reference first to FIG. 1, there is shown a simplified perspective view of a section of an infrastructure 100, in this instance, a data center, in which a method and controller for controlling one or more adaptive vent tiles (AVTs) may be implemented, according to an example. It should be understood that the infrastructure 100 may include additional elements and that some of the elements described herein may be removed and/or modified without departing from a scope of the infrastructure 100. For instance, although particular reference is made to the infrastructure comprising a data center, it should be understood that the embodiments of the invention disclosed herein may be practiced in any suitable infrastructure, such as, an office building, a home, or other structure. It should further be understood that the AVTs disclosed herein may be positioned at any suitable location other than a raised floor, such as, on a ceiling, a wall, within a plenum, at the exhaust of a fluid moving device, etc.

The infrastructure 100 is depicted as having a plurality of racks 102a-102n, a plurality of fluid moving devices 114a-114n, a plurality of electronic components 116, a plurality of vent tiles 118, and a plurality of sensors 120a-120n. As discussed in greater detail herein below, environmental condition information collected by the sensors 120a-120n may be used to identify correlations between opening levels of the AVTs 118 and the environmental conditions detected at or in the electronic components 116. According to another example, however, the correlations may be identified through implementation of a suitable computational fluid dynamics tool. In any regard, the opening levels of the AVTs 118 may be modified based upon the identified correlations. In addition, the identified correlations and/or the opening levels of the AVTs 118 may be modified based upon an error level between detected environmental conditions and predefined environmental conditions.

The racks 102a-102n are positioned on a raised floor 110 and house electronic devices 116 capable of generating/dissipating heat, for instance, computers, servers, bladed servers, disk drives, displays, etc. As shown by the arrows 124 in FIG. 1, fluid, such as, cool airflow, is delivered through vent tiles 118 in the floor 110 to the electronic components 116 housed in the racks 102a-102n. Some or all of the vent tiles 118 may comprise AVTs 118. The vent tiles 118 that are not AVTs may comprise vent tiles having fixed openings. The AVTs 118 are generally configured to be opened and closed over a relatively wide range of opening levels to thus vary the flow rate of fluid supplied from beneath the raised floor 110. In addition, the AVTs 118 may be configured to be remotely opened and closed.

In order to effectuate the remote manipulation, actuators (not shown) may be provided to vary the opening levels of one or more of the AVTs 118. In addition, each of the AVTs 118 may also include an interface through which the AVTs 118 may receive instruction signals from a controller 130. Although the AVTs 118 may have many different suitable configurations without departing from a scope of the present invention, examples of suitable AVTs 118 may be found in commonly assigned and copending U.S. patent application Ser. Nos. 11/353,557, 11/764,410, and 12/480,429, which have been introduced above. As discussed in each of these applications for patent, the opening levels of the vent tiles are remotely and automatically controllable.

The fluid contained in the space 112 may include fluid supplied by one or more fluid moving devices 114a-114n, and in certain instances, fluid flow recirculated into the space 112. Thus, characteristics of the fluid, such as, temperature, pressure, humidity, flow rate, etc., delivered to various locations in the infrastructure 100 through the vent tiles 118 may substantially be affected by the operations of a plurality of the fluid moving devices 114a-114n. In this regard, varying the opening level of one of the AVTs 118 may result in a different environmental condition at an electronic component 116 as compared with varying the opening level of another one of the AVTs 118 positioned at a different location in the infrastructure 100. In other words, varying the opening levels of multiple AVTs 118 may not result in the same environmental condition change. As such, and as discussed in greater detail herein below, correlations between the opening levels of one or more AVTs 118 and the environmental conditions detected by one or more of the sensors 120a-120n are identified to determine how varying the opening levels of the AVT(s) 118 are predicted to affect the conditions detected by the sensor(s) 120a-120n.

The sensors 120a-120n may be networked with a controller 130 and may be configured to convey detected condition information through any suitable wired or wireless means to the controller 130. The detected conditions may include, for instance, temperature, pressure, fluid flow volume, humidity, etc. As described below, the controller 130 may employ the condition information received from the sensors 120a-120n to identify correlations between the opening levels of the AVTs 118 and the conditions detected by the sensors 120a-120n. The controller 130 is also configured to identify errors between the detected environmental conditions and reference environmental conditions. The controller 130 is further configured to determine opening levels for one or more of the AVTs 118 based upon the identified correlations and errors. Moreover, the controller 130 is configured to communicate instructions to the AVTs 118 to manipulate their respective actuators to cause the AVTs 118 to have the determined opening levels.

Although the controller 130 is illustrated in FIG. 1 as comprising an element separate from the electronic components 116, the controller 130 may comprise or be integrated with one or more of the electronic components 116 without departing from a scope of the infrastructure 100 disclosed herein. In addition, or alternatively, the controller 130 may comprise software configured to operate on a computing device, for instance, one of the electronic components 116 or a separate computing device. Moreover, although a single controller 130 has been depicted in FIG. 1, a plurality of controllers 130 may be implemented to respectively control individual or groups of AVTs 118. In addition, the plurality of controllers 130 may be arranged to operate in a hierarchical manner, such that, a higher level controller 130 may supersede operations of one or more lower level controllers 130.

Figure 2:
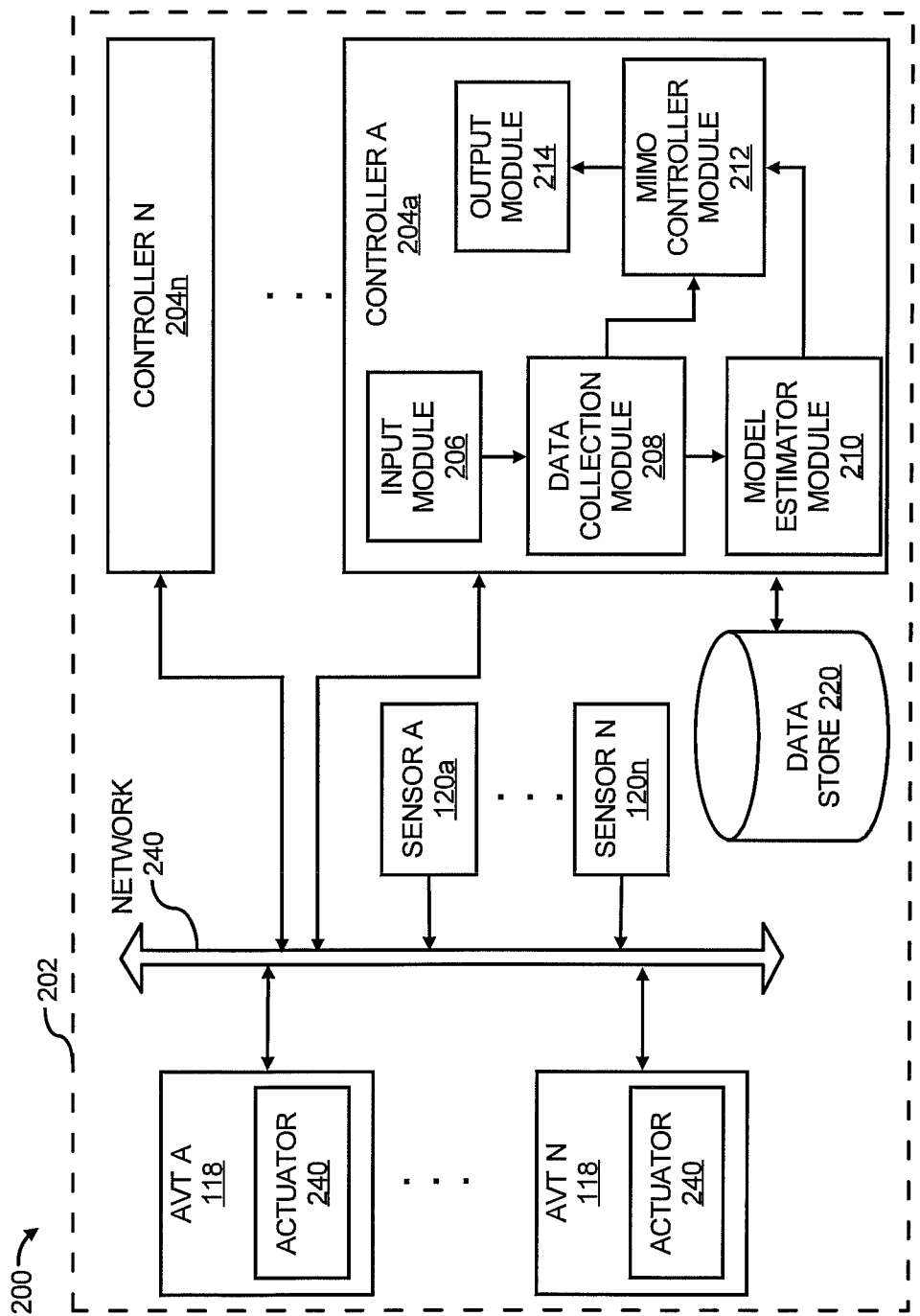
FIG. 2 shows a block diagram of a system for controlling one or more AVTs in an infrastructure, according to an embodiment of the invention.

Turning now to FIG. 2, there is shown a block diagram 200 of a system 202 for controlling one or more AVTs 118 in an infrastructure, such as the infrastructure 100 depicted in FIG. 1, according to an example. It should be understood that the following description of the block diagram 200 is but one manner of a variety of different manners in which such a system 202 may be configured. In addition, it should be understood that the system 202 may include additional components and that some of the components described herein may be removed and/or modified without departing from a scope of the system 202. For instance, the system 202 may include any number of sensors, memories, processors, AVTs 118, etc., as well as other components, which may be implemented in the operations of the system 202.

As shown, the system 202 includes a plurality of controllers 204a-204n, each of which may be equivalent to the controller 130 depicted in FIG. 1 and discussed above. In addition, each of the controllers 204b-204n may be configured similarly to the controller 204a. As such, except as otherwise noted below, the descriptions of the controllers 204b-204n are intended to be identical to that of the controller 204a, which is depicted as including an input module 206, a data collection module 208, a model estimator module 210, a Multi-Input Multi-Output (MIMO) controller module 212, and an output module 214.

According to an example, each of the controllers 204a-204n comprises software stored, for instance, in a volatile or non-volatile memory, such as DRAM, EEPROM, MRAM, flash memory, floppy disk, a CD-ROM, a DVD-ROM, or other optical or magnetic media, and the like. In this example, the modules 206-214 comprise software modules stored in the memory, which are executable, for instance, by one or more processors of a computing device (not shown). According to another example, each of the controllers 204a-204n comprises a hardware device, such as, a circuit or multiple circuits arranged on a board. In this example, the modules 206-214 comprise circuit components or individual circuits, which may also be controlled by one or more processors of a computing device. According to a further example, the controllers 204a-204n comprise a combination of hardware and software modules.

Generally speaking, each of the controllers 204a-204n is configured to automatically identify correlations between opening levels of the AVTs 118 to which each of the controllers 204a-204n respectively has control and an environmental condition at one or more heat dissipating devices contained in an infrastructure. The heat dissipating devices may include the electronic devices 116 discussed above, or other heat dissipating devices that may be found in an infrastructure, such as, an office building or a home. Thus, for instance, each of the controllers 204a-204n may be configured to control one or more of the AVTs 118 to thus manipulate conditions local to the AVTs 118 under their respective controls. For example, the controllers 204a-204n are configured to respectively control AVTs 118 that are in relatively close geographic locations with respect to each other. As another example, the controllers 204a-204n are configured to respectively control AVTs 118 that are grouped together based upon factors other than geographic proximities with respect to each other. For instance, the controller 204a may be configured to control a plurality of AVTs 118 whose variations in opening levels affect the same electronic components 116, even though the plurality of AVTs 118 are not geographically co-located.

In addition, each of the controllers 204a-204n is configured to determine opening levels for the AVTs 118 under their respective controls based upon the identified correlations. Each of the controllers 204a-204n is also configured to implement an error-feedback loop between environmental conditions detected at locations proximate to or within the one or more heat dissipating devices and reference environmental conditions in determining the opening levels for the AVTs 118 under their respective controls.

In performing these functions, the controllers 204a-204n are configured to receive the condition information detected by the sensors 120a-120n over a network 240 that operates to couple the various components of the system 202. The network 240 generally represents a wired or wireless structure in the infrastructure for the transmission of data between the various components of the system 202.

The controllers 204a-204n are configured to store the condition information received from the sensors 120a-120n in one or more data stores 220, which may comprise any reasonably suitable memory upon which the controllers 204a-204n may store data and from which the controllers 204a-204n may retrieve data. Although the data store 220 has been depicted as forming a separate component from the controller 204a, it should be understood that the data store 220 may be integrated with the analyzer 204a without departing from a scope of the system 200. In addition, each of the controllers 204a-204n may include a respective data store 220 or one or more of the controllers 204a-204n may share one or more data stores 220.

The controllers 204a-204n may also output the determined opening levels and/or instructions pertaining to the determined opening levels through the output module 214. Thus, for instance, the determined opening levels may be outputted to a display upon which the outputted information may be displayed, a printer upon which the outputted information may be printed, a network connection over which the outputted information may be conveyed to another computing device, a data storage device upon which the outputted information may be stored, etc. According to another example, the controllers 204a-204n are configured to communicate instruction signals over the network 240 to one or more of the AVTs 118. In this example, the actuators 240 of the AVTs 118 may be configured to vary the opening levels of their respective AVTs 118 to cause the AVTs 118 to have the opening levels as instructed by the controllers 204a-204n.

Figure 3:
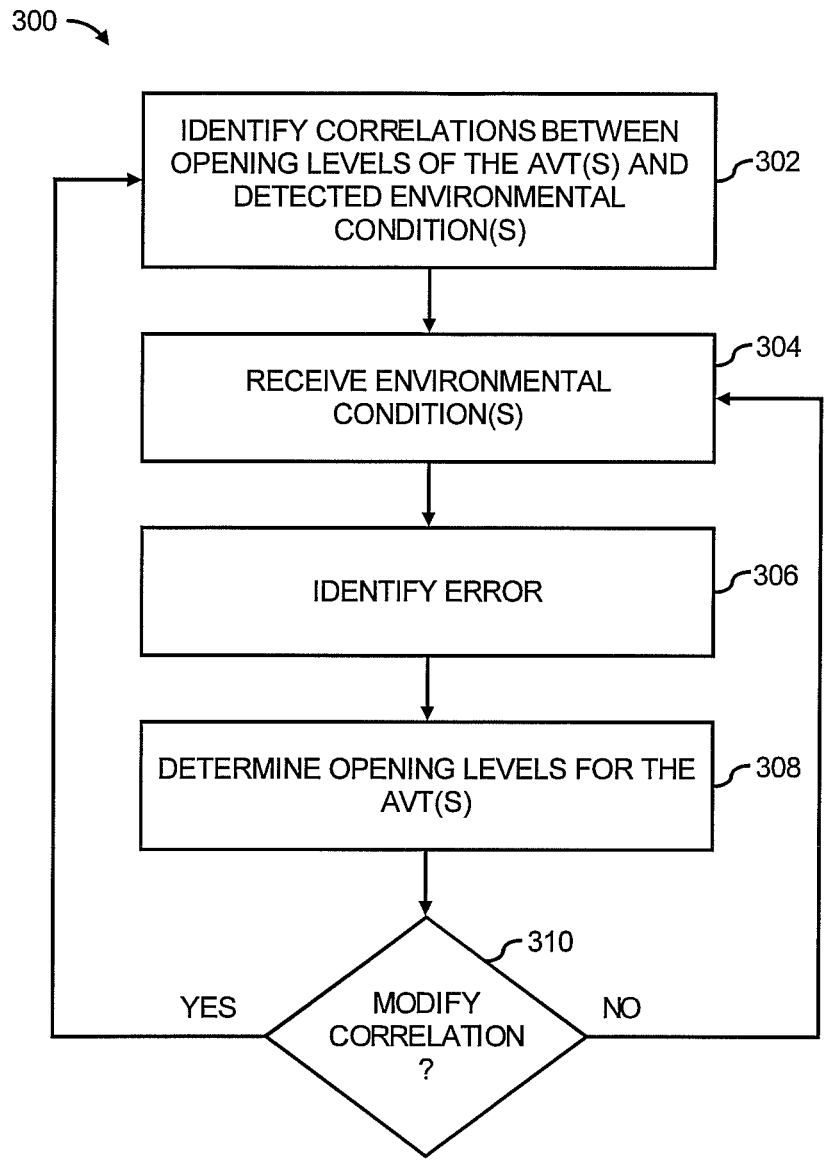
FIG. 3 depicts a flow diagram of a method for manipulating environmental conditions in an infrastructure containing one or more AVTs, according to an embodiment of the invention.
Figure 4:
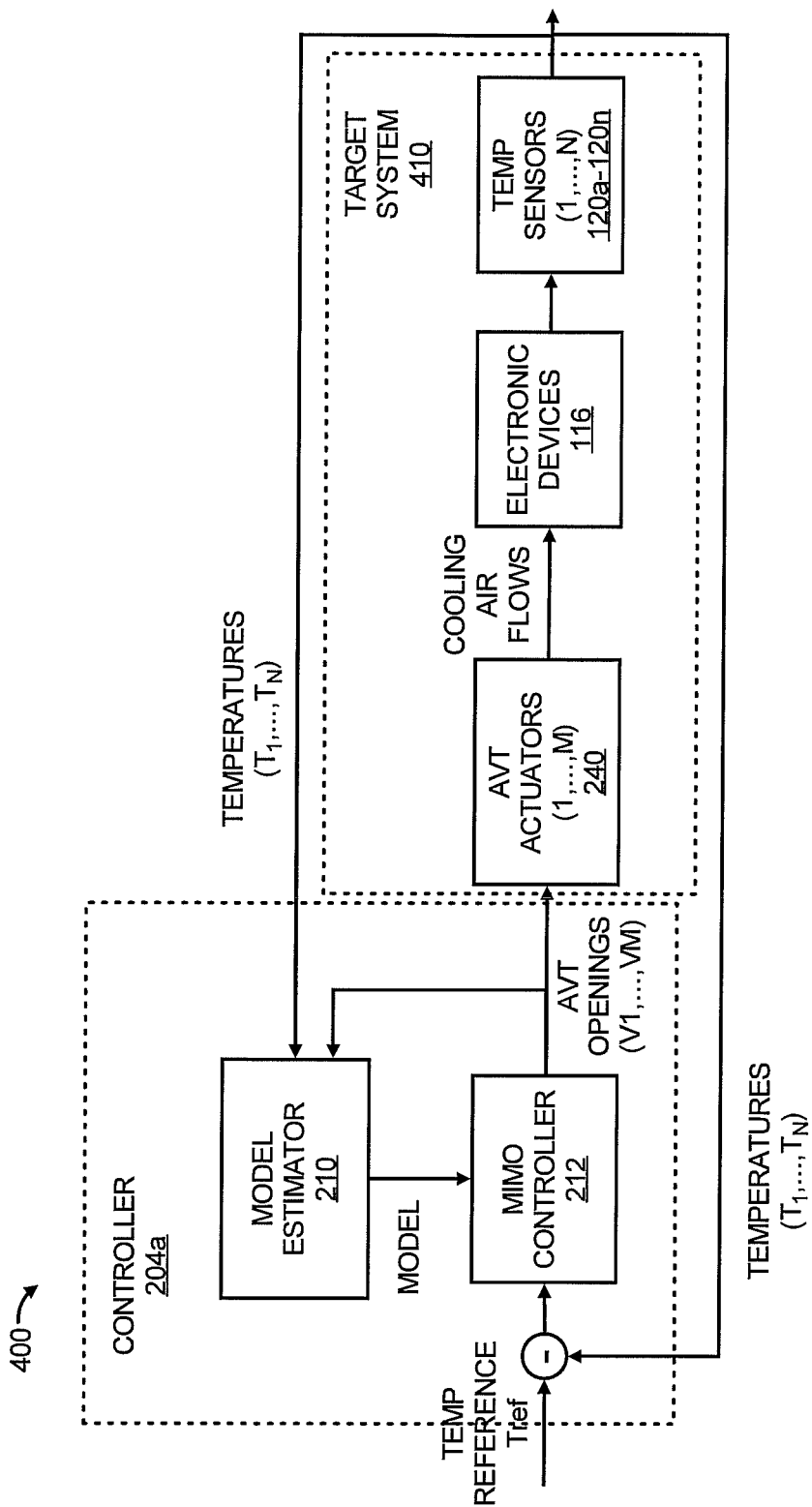
FIG. 4 depicts a feedback control diagram of a controller, according to an embodiment of the invention.

Various manners in which the modules 206-214 of the controller 204a-204n may operate are discussed with respect to the method 300 depicted in FIG. 3 and the feedback control diagram 400 depicted in FIG. 4. With reference first to FIG. 3, there is shown a flow diagram of a method 300 for manipulating environmental conditions in an infrastructure containing one or more AVTs 118, according to an example. It should be apparent to those of ordinary skill in the art that the method discussed below with respect to FIG. 3 represents a generalized illustration and that other steps may be added or existing steps may be removed, modified or rearranged without departing from the scope of the method 300.

Although particular reference is made to the controllers 204a-204n depicted in FIG. 2 as performing the steps outlined in the method 300, it should be understood that the method 300 may be performed by a differently configured controller 204a-204n without departing from a scope of the method 300. In addition, particular reference is made to one of the controllers 204a in order to simplify the description of the method 300, however, it should be understood that the processes performed by the controller 204a are applicable to the other controllers 204a-204n with respect to the AVTs 118 over which they have control.

At step 302, correlations between opening levels of the one or more AVTs 118 and environmental conditions at one or more heat dissipating devices are identified, for instance, by the model estimator module 210. More particularly, for instance, the correlations are identified to enable prediction of the effects that changing the opening levels of one or more of the AVTs 118 are likely to have on the environmental conditions detected by the sensors 120a-120n. By way of particular example in which the detected environmental conditions comprise temperature, the correlation identified at step 302 is configured to enable prediction of temperature changes at or in the electronic components 116 in response to changes in the opening levels of the AVTs 118.

According to a first embodiment, the model estimator module 210 may collect AVT 118 opening levels and environmental condition measurements detected by the sensors 120a-120n over a period of time and identifies the correlation between the AVTs 118 and the environmental condition measurements from the collected data. In a second embodiment, the model estimator module 210 may implement a computational fluid dynamics program to predict the correlation between the opening levels of the AVTs 118 and the environmental condition measurements. In either embodiment, the model estimator module 210 is configured to employ the collected data in generating a model that describes the correlations between the opening levels of the AVTs 118 and the environmental conditions resulting from the opening levels.

According to a particular example, the relationship between the opening levels of multiple AVTs 118 and the environmental conditions affected by the opening levels, in this case temperature, may be modeled using an auto-regressive-moving-average (ARMA) model, such as:

$$T(k) = \sum_{i=1}^{n} A_i T(k-i) + \sum_{j=0}^{n-1} B_j V(k-j).$$

Equation (1)

In Equation (1), k corresponds to the k-th sampling and control interval, n is the system over representing the amount of history, A is a matrix containing model parameters that capture the correlation between the temperatures, and B is a matrix containing model parameters that are coefficients that capture the correlation between the current temperatures and the AVT 118 opening levels. In addition, the AVT 118 opening levels (V), which may be the percent opening levels of the AVTs 118, are denoted as V=($V_1, \ldots, V_M$) and the detected environmental conditions (T) are denoted as T=($T_1, \ldots, T_N$).

The model parameters in the matrices A and B may be derived by varying the percent openings of all of the AVTs 118 randomly and independently between 0 and 100%, and collecting the temperature measurements detected by the sensors 120a-120n at intervals of time over a period of time. The time intervals and the period of time may be selected to allow for actuator and sensor delays also being sufficiently short to capture transient behaviors. In addition, the AVT 118 opening levels and the temperature measurements may be fed into a linear regression solver that infers a linear MIMO model that represents the dynamic inter-relationships between the opening levels of the AVTs 118 and the temperatures. By way of particular example, a first-order ARMA model may be used to describe the relationship between the opening levels of the AVT 118 and the temperatures under control, such as:

$$T(k)=AT(k-1)+BV(k). \quad \text{Equation (2)}$$

It should be understood that the correlations between the opening levels of the AVTs 118 and the detected environmental conditions may be identified through implementation of any suitable process. An example of a suitable process is disclosed in the Ser. No. 10/960,573 application for patent discussed above.

In any respect, at step 302, the correlations may be determined through implementation of an off-line or online modeling operation. By way of example, the off-line modeling operation may involve randomly changing the opening levels of the AVTs 118 from interval to interval and measuring the temperature at each interval and using a linear regression algorithm to identify the relationship between the opening levels of the AVTs 118 and the temperatures. As an example of the online modeling operation, the model may be identified through use of recursive algorithms. Thus, for instance, the offline modeling operation is configured to develop a model based upon the configuration at the point in time in which the model is developed, whereas, the online modeling operation is configured to update the model that sampled or controlled intervals. In instances where the offline modeling is sufficient, the online modeling may be unnecessary. In addition, the online modeling may be performed without the offline modeling having been performed first.

In addition, the correlations identified at step 302 may identify one or both of quantitative and qualitative correlations between the opening levels of the one or more AVTs 118 and the environmental conditions at or within the one or more electronic components 116. The qualitative correlations may define which of the AVTs 118 affect which of the electronic components 116 and the quantitative correlations may define the levels to which changes in the opening levels of the AVTs 118 affect the electronic components 116 under control.

At step 304, the environment conditions detected by the sensors 120a-120n are received, for instance, through the input module 206. In addition, the data collection module 208 may store the received environmental conditions in the data store 220.

At step 306, a determination as to whether an error between the received environmental conditions and reference environmental conditions is made. The reference environmental conditions may comprise those conditions that have been identified as being the minimum (or maximum) allowable conditions at or within the heat dissipating devices. Thus, for example, the reference environmental conditions may comprise the minimum desired or allowable inlet temperatures for the heat dissipating devices. As such, the error between the detected temperatures and the reference temperature may be used to identify the AVT 118 opening levels that result in efficient supply of cooling resources to the heat dissipating devices.

At step 308, the opening levels for the AVTs 118 are determined, for instance, by the MIMO controller module 212. Generally speaking, the MIMO controller module 212 may receive multiple inputs from multiple sensors 120a-120n and may output instructions for multiple outputs, comprising multiple AVTs 118. Various types of controllers may be implemented in determining the opening levels for the AVTs 118, without departing from a scope of the invention. According to a first example, a Proportional, Integral, Derivative (PID) controller is implemented to compute the opening levels (V(k+1)) for one or more of the AVTs 118 for a next control interval (k+1) through:

$$V(k+1) = Kp \times E(k) + Ki \times \sum_{j=1}^{k} E(j). \quad \text{Equation (3)}$$

In Equation (3), $E(k)T_{ref}-T(k)$, Kp and Ki are gain parameters in the form of matrices, and the opening levels (V(k+1)) for the AVTs 118 for a next control interval (k+1) are proportional to the errors between the received one or more environmental conditions and one or more reference environmental conditions for a current control interval and a cumulative sum of the errors until the kth control interval. In this example, the PID controller is configured to minimize a quadratic cost function in a Linear Quadratic Regulator (LQR) problem to determine the gain parameters.

According to a second example, an online model estimator using a Recursive Linear Square (RLS) algorithm is implemented to determine the opening levels for one or more of the AVTs 118. In this example, the online model estimator, for which one model for each temperature variable and the opening levels of three AVTs 118 may be represented by:

$$-T_i(k+1)=a_iT_i(k)+b_{i1}V_1(k)+b_{i2}V_2(k)+b_{i3}V_3(k)+n_i(k),$$
$$\text{for } i=1,2,3 \quad \text{Equation (4)}$$

respectively.

In Equation (4), the variable $n_i(k)$ represents disturbances that are not accounted for by the model. More particularly, the variable $n_i(k)$ is a sequence of random variables that are assumed independent, identically distributed, and independent of the inputs and outputs of the model. In vector form, Equation (4) becomes:

$$T_i(k+1) = [T_i(k)V_1(k)V_2(k)V_3(k)] \begin{bmatrix} a_i \\ b_{i1} \\ b_{i2} \\ b_{i3} \end{bmatrix} + n_i(k). \quad \text{Equation (5)}$$

For each model in Equation (5), an RLS estimator is implemented with directional forgetting to estimate the model parameters online. In addition, for a model defined as:

$$y(k+1)=\phi(k)^T\theta(k)+n(k). \quad \text{Equation (6)}$$

In Equation (6), y(k+1) is the performance metric, $\phi(k)$ is the measurement available in the interval k, $\theta(k)$ is the model parameters, and the parameters may be estimated recursively as follows:

$$e(k+1) = y(k) - \varphi(k)^T \theta(k) \quad \text{Equation (7)}$$
$$K(k+1) = P(k)\varphi(k)/(\lambda + \varphi(k)^T P\varphi(k))$$
$$\theta(k+1) = \theta(k) + K(k+1)*e(k+1)$$
$$P^{-1}(k+1) = P^{-1}(k) + \frac{(1+(\lambda-1)\varphi^T(k)P(k)\varphi(k))}{(\varphi^T(k)\varphi(k))^2}\varphi(k)\varphi^T(k).$$

In the recursive algorithm, the initial value $\theta(0)$ is configured, for instance, using parameters identified offline. P(k) represents the covariance of the noise, usually initialized as a very large diagonal matrix, the variable e(k) is the estimate error, the parameter $\lambda$ is the forgetting factor between 0 and 1. A smaller value of $\lambda$ results in a fast forgetting of the history.

According to a third example, a model predictive controller (MPC) is implemented to determine the opening levels for one or more of the AVTs 118. In this example, the MPC may be configured to minimize a general cost function defined as:

$$\min_{V(k),V(k+1),\ldots,V(k+nu-1)} J = \quad \text{Equation (8)}$$
$$\sum_{i=1}^{np} (\|T(k+i) - T_{ref}\|_Q^2) + \sum_{i=0}^{nu-1} (\|V(k+i)\|_R^2),$$

In Equation (8), the np and nu are prediction and input horizons, respectively, matrix Q provides a way to differentiate temperature (T) errors of the one or more electronic components and matrix R weights the opening levels of the vent tiles.

In addition, a plurality of constraints may be applied for both inputs and outputs. Examples of suitable constraints include:

$$T(k+i) \leq T_{ref}, i=1,2,\ldots,np. \quad \text{Equation (9)}$$
$$V(k+i) \leq V_{max}, i=0,1,\ldots,nu-1. \quad \text{Equation (10)}$$
$$V(k+i) \geq V_{min}, i=0,1,\ldots,nu-1. \quad \text{Equation (11)}$$
$$|V(k+i-V(k+i-1)| \leq \Delta V_{max}, i=0,1,\ldots,nu-1. \quad \text{Equation (12)}$$

In Equations (8)-(12), the temperatures (T(k+i)) are upper bounded by the reference temperatures ($T_{ref}$) and the opening levels (V(k+i)) are limited in the range of [$V_{min}$ $V_{max}$]. The problem defined by Equations (8)-(12) and the model in Equation (1) is a quadratic optimization problem with linear constraints, which may be solved through implementation of any reasonably suitable solver, such as a conventional tool for solving optimization problems.

According to a particular example, the controller is configured to operate as an optimal controller configured to minimize the temperature difference in a predefined thermal zone subject to the constraints on the temperatures and the AVT 118 opening levels.

The controllers 204a-204n may be employed to control respective groups of AVTs 118, with each group including one or more AVTs 118, for instance, to tune the temperature distributions in respective thermal zones. In another example, the controller 204a-204n may be implemented with zonal controllers that may coordinate the operations of multiple ones of the controllers 204a-204n. By way of particular example, the fluid moving device controllers (not shown) may be configured to dynamically tune the temperature setpoints and/or blower speeds to maintain the air temperatures returned to the fluid moving devices 114a-114n below predefined thresholds, while the controllers 204a-204n control the opening levels of the AVTs 118 in real time to maintain the intake temperatures of the racks 102a-102n below thresholds or to minimize the temperature difference of the racks 102a-102n. As another particular example, the fluid moving device controllers may dynamically tune the temperature setpoints and/or blower speeds to maintain the intake air temperatures of the racks 102a-102n below predefined thresholds, while the controllers 204a-204n minimize the temperature difference of the racks 102a-102n by tuning the opening levels of the AVTs 118 online. As a further particular example, the fluid moving device controllers may dynamically tune the temperature setpoints and/or blower speeds to maintain the static pressure inside the plenum 112, while the controllers 204a-204n maintain the intake temperatures of the racks 102a-102n below predefined thresholds.

With reference to FIG. 4, there is shown a feedback control diagram 400, according to an example. As shown therein, the MIMO controller module 212 is configured to receive as inputs, information from the model estimator module 210 and the detected error. More particularly, the model estimator module 210 is configured to generate a model, either offline or online, and as either a steady-state or a dynamic model, of the correlation between the AVTs 118 and the environment conditions (here, temperature) detected at or within the electronic devices 116, as discussed above. In addition, the MIMO controller module 212 receives the model from the model estimator 210 as well as the error information. Moreover, the MIMO controller module 212 evaluates the error information using the model to determine how one or more of the AVT 118 opening levels are to be manipulated.

Generally speaking, the MIMO controller module 212 is configured to determine which of the actuators 240 of the AVTs 118 should be operated to vary the opening levels to achieve the temperature reference values for the sensors 120a-120n in any of the manners discussed above. In addition, the model estimator 210 may be configured to update the model of the correlation between the opening levels of the AVTs 118 and the detected environmental conditions as conditions change in the infrastructure 100, which may occur as the opening levels in the AVTs 118 change.

Each of the controllers 204a-204n may be employed to control respective groups of AVTs 118, with each group including one or more AVTs 118, for instance, to tune the temperature distribution in respective thermal zones. In another example, the controller 204a-204n may be implemented with zonal controllers that may coordinate the operations of multiple ones of the controllers 204a-204n. By way of particular example, the fluid moving device controllers (not shown) may be configured to dynamically tune the temperature setpoints and/or lower speeds to maintain the air temperatures returned to the fluid moving devices 114a-114n below predefined thresholds, while the controllers 204a-204n control the opening levels of the AVTs 118 in real time to maintain the intake temperatures of the racks 102a-102n below thresholds or to minimize the temperature difference of the racks 102a-102n. As another particular example, the fluid moving device controllers may dynamically tune the temperature setpoints and/or blower speeds to maintain the intake air temperatures of the racks 102a-102n below predefined thresholds, while the controllers 204a-204n minimized the temperature difference across the racks 102a-102n by tuning the opening levels of the AVTs 118 online. As a further particular example, the fluid moving device controllers may dynamically tune the temperature setpoints and/or blower speeds to maintain the static pressure inside the plenum 112, while the controllers 204a-204n maintain the intake temperatures of the racks 102a-102n below predefined thresholds.

With reference back to FIG. 3, at step 310, the model estimator module 210 may determine whether a previously identified correlation requires modification. For instance, the model estimator module 210 may determine that the previously identified correlation is no longer valid, if, for instance, conditions at the electronic devices 116 do not change as expected following manipulation of the AVT 118 opening levels. In this instance, the correlations between the opening levels of the AVTs 118 and the detected environmental conditions may be updated again, and steps 304-310 may be repeated. Otherwise, the model estimator module 210 and the MIMO controller module 212 may continue to receive the environmental conditions detected by the sensors 120a-120n at step 304, and steps 306-310 may be repeated. Thus, for instance, at step 310, the model estimator module 210 may update a model that was generated offline based upon information collected online.

Some or all of the operations set forth in the method 300 may be contained as a utility, program, or subprogram, in any desired computer accessible medium. In addition, the method 300 may be embodied by a computer programs, which can exist in a variety of forms both active and inactive. For example, they may exist as software program(s) comprised of program instructions in source code, object code, executable code or other formats. Any of the above may be embodied on a computer readable storage medium.

Exemplary computer readable storage media include conventional computer system RAM, ROM, EPROM, EEPROM, and magnetic or optical disks or tapes. Concrete examples of the foregoing include distribution of the programs on a CD ROM or via Internet download. It is therefore to be understood that any electronic device capable of executing the above-described functions may perform those functions enumerated above.

Figure 5:
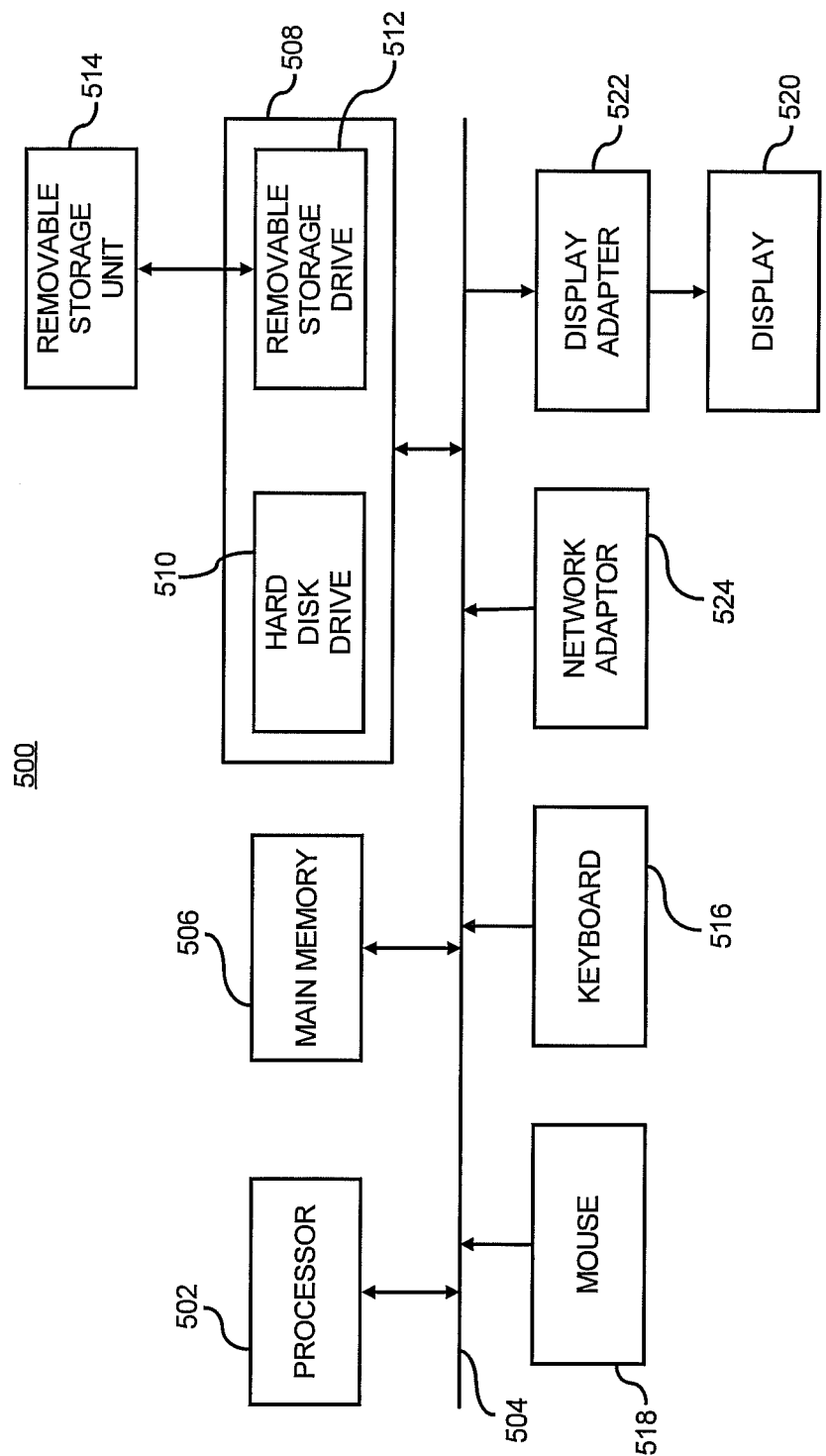
FIG. 5 illustrates a computer system, which may be employed to perform various functions described herein, according to an embodiment of the invention.

FIG. 5 illustrates a block diagram of a computing apparatus 500 configured to implement or execute the method 300 depicted in FIG. 3, according to an example. In this respect, the computing apparatus 500 may be used as a platform for executing one or more of the functions described hereinabove with respect to the controllers 204a-204n.

The computing apparatus 500 includes a processor 502 that may implement or execute some or all of the steps described in the method 300. Commands and data from the processor 502 are communicated over a communication bus 504. The computing apparatus 500 also includes a main memory 506, such as a random access memory (RAM), where the program code for the processor 502, may be executed during runtime, and a secondary memory 508. The secondary memory 508 includes, for example, one or more hard disk drives 510 and/or a removable storage drive 512, representing a floppy diskette drive, a magnetic tape drive, a compact disk drive, etc., where a copy of the program code for the method 300 may be stored.

The removable storage drive 510 reads from and/or writes to a removable storage unit 514 in a well-known manner. User input and output devices may include a keyboard 516, a mouse 518, and a display 520. A display adaptor 522 may interface with the communication bus 504 and the display 520 and may receive display data from the processor 502 and convert the display data into display commands for the display 520. In addition, the processor(s) 502 may communicate over a network, for instance, the Internet, LAN, etc., through a network adaptor 524.

It will be apparent to one of ordinary skill in the art that other known electronic components may be added or substituted in the computing apparatus 500. It should also be apparent that one or more of the components depicted in FIG. 5 may be optional (for instance, user input devices, secondary memory, etc.).

What has been described and illustrated herein is a preferred embodiment of the invention along with some of its variations. The terms, descriptions and figures used herein are set forth by way of illustration only and are not meant as limitations. Those skilled in the art will recognize that many variations are possible within the spirit and scope of the invention, which is intended to be defined by the following claims—and their equivalents—in which all terms are meant in their broadest reasonable sense unless otherwise indicated.

What is claimed is:

1. A method for manipulating environmental conditions in an infrastructure containing one or more adaptive vent tiles, said method comprising:
   in a computing device, identifying correlations between opening levels of the one or more adaptive vent tiles and an environmental condition at one or more heat dissipating devices, wherein identifying the correlations further comprises modeling the correlations;
   receiving one or more environmental conditions at locations proximate to or within the one or more heat dissipating devices;
   identifying errors between the received one or more environmental conditions and one or more reference environmental conditions; and
   determining opening levels for the one or more adaptive vent tiles based upon the identified correlations and errors.

2. The method according to claim 1, wherein the one or more adaptive vent tiles comprise one or more actuators for varying the opening levels, said method further comprising:
   controlling the one or more actuators to vary the opening levels be one or more adaptive vent tiles to attain the determined opening levels in the one or more adaptive vent tiles.

3. The method according to claim 1, further comprising:
   collecting one or more environmental conditions at locations proximate to or within the one or more heat dissipating devices responsive to multiple opening levels of the one or more adaptive vent tiles; and
   wherein modeling the correlations further comprises modeling the correlations from the collected one or more environmental conditions.

4. The method according to claim 1, wherein modeling the correlations further comprises implementing a computational fluid dynamics tool to model the correlations.

5. The method according to claim 1, wherein modeling the correlations further comprises modeling the correlations as one of steady-state and dynamic models.

6. The method according to claim 1, wherein modeling the correlations further comprises modeling the correlations through one of an offline and an online operation.

7. A method for manipulating environmental conditions in an infrastructure containing one or more adaptive vent tiles, said method comprising:
   in a computing device, identifying one or both of quantitative and qualitative correlations between the opening levels of the one or more adaptive vent tiles and the environmental condition at the one or more heat dissipating devices to identify correlations between opening levels of the one or more adaptive vent tiles and an environmental condition at one or more heat dissipating devices;

receiving one or more environmental conditions at locations proximate to or within the one or more heat dissipating devices;

identifying errors between the received one or more environmental conditions and one or more reference environmental conditions; and determining opening levels for the one or more adaptive vent tiles based upon the identified correlations and errors.

8. The method according to claim 1, further comprising:

determining whether the identified correlations between opening levels of the one or more adaptive vent tiles and an environmental condition at the one or more heat dissipating devices require modification; and modifying the correlations between the opening levels of the one or more adaptive vent tiles and an environmental condition at the one or more heat dissipating devices in response to a determination that the identified correlations require modification.

9. The method according to claim 1, wherein determining the opening levels for the one or more adaptive vent tiles further comprises determining the opening levels that minimize cooling resource utilization in the infrastructure while meeting predefined environmental condition thresholds.

10. The method according to claim 1, wherein determining the opening levels for the one or more adaptive vent tiles further comprises determining the opening levels that minimize environmental differences across a plurality of the heat dissipating devices.

11. A controller for manipulating environmental conditions in an infrastructure containing one or more adaptive vent tiles, said controller comprising:

a model estimator module to identify correlations between opening levels of the one or more adaptive vent tiles and environmental conditions at one or more heat dissipating devices to generate the model;

a multi-input multi-output (MIMO) controller module to receive the model from the model estimator, to receive a plurality of environmental conditions at locations proximate to or within the one or more heat dissipating devices, and to determine opening levels for the one or more adaptive vent tiles based upon the model and errors between the collected environmental condition information and one or more reference environmental conditions; and an output module to output the determined opening levels for the one or more adaptive vent tiles.

12. The controller according to claim 11, wherein the model estimator module is to identify the correlations at least one of online using recursive algorithms and offline using historical information.

13. The controller according to claim 11, wherein the model estimator module is to model the correlations using detected environmental condition information.

14. The controller according to claim 11, wherein the model estimator module is to model the correlations through implementation of a computational fluid dynamics tool.

15. The controller according to claim 11, wherein the model estimator module is to model the correlations as one of a steady-state model and a dynamic model.

16. The controller according to claim 11, wherein the MIMO controller module is to determine the opening levels for the one or more of adaptive vent tiles that minimize cooling resource utilization while meeting predefined environmental condition thresholds.

17. The controller according to claim 11, wherein the MIMO controller module is to determine the opening levels for the one or more of adaptive vent tiles that minimize environmental differences across a plurality of the heat dissipating devices.

18. A non-transitory computer readable storage medium on which is embedded one or more computer programs, said one or more computer programs implementing a method for manipulating environmental conditions in an infrastructure containing one or more adaptive vent tiles, said one or more computer programs comprising a set of instructions to cause a processor to:

model correlations between opening levels of the one or more adaptive vent tiles and an environmental condition at one or more heat dissipating devices;

receive one or more environmental conditions at locations proximate to or within the one or more heat dissipating devices;

identify errors between the received one or more environmental conditions and one or more reference environmental conditions; and determine opening levels for the one or more adaptive vent tiles based upon the identified correlations and errors.

* * * * *